United States Patent [19]
Lin

[11] Patent Number: 5,831,829
[45] Date of Patent: Nov. 3, 1998

[54] HEAT DISSIPATING DEVICE FOR CENTRAL PROCESSING UNITS

[76] Inventor: Mike Lin, No. 56, Lane 55, Dong-Rong Rd., Sei-Rong Village, Da-Lei Hsiang, Tai-Chung Hsien, Taiwan

[21] Appl. No.: 685,898

[22] Filed: Jul. 18, 1996

[51] Int. Cl.⁶ .................................................. H05K 7/20
[52] U.S. Cl. .................... 361/704; 361/697; 361/710; 257/706; 257/707; 257/718; 257/719; 165/80.3; 24/458
[58] Field of Search .................................. 165/80.3, 185; 361/687, 697, 704, 710; 174/16.3; 257/706, 707, 713, 718, 719, 726, 727; 24/458, 625, 573

[56] References Cited

U.S. PATENT DOCUMENTS

| | | | |
|---|---|---|---|
| 5,357,404 | 10/1994 | Bright et al. | 361/704 |
| 5,436,798 | 7/1995 | Wieland, Jr. | 361/710 |

Primary Examiner—Leo P. Picard
Assistant Examiner—Boris L. Chervinsky
Attorney, Agent, or Firm—Pro-Techtor International Services

[57] ABSTRACT

A heat dissipating device for CPUs includes a dissipating device mounted on a CPU and having a transverse groove near either lateral positioning end, the transverse groove having a depth greater than a groove between every two adjacent dissipating plates of the dissipating device. A first positioning strip is bent to have a substantially vertical portion having a hook end for engaging a securing substrate of the CPU and a substantially horizontal portion having a slanting portion with a tongue for engaging one of the transverse grooves. A second positioning strip also has a slanting portion with a tongue for engaging the other of the transverse grooves. The second positioning strip further has a notch for engaging an indentation of a connecting element that comprises a substantially vertical portion with a hook hole for engaging the securing substrate of the CPU.

2 Claims, 8 Drawing Sheets

HEAT DISSIPATING DEVICE FOR CENTRAL PROCESSING UNITS

BACKGROUND OF THE INVENTION (a) Field of the Invention:

The present invention relates generally to a heat dissipating device for central processing units (CPUs), and more particularly to a CPU heat dissipating device that is simple to manufacture and assemble.

(b) Description of the Prior Art:

With the fast development of computers, their operational speed has increased considerably. On the other hand, as the CPU may become overheated under prolonged high-speed operation, it is necessary to provide a heat dissipating device to further raise the operational speed of the computer and to extend the operational time.

Prior dissipating devices are mostly mounted and positioned on the CPU directly. A disadvantage is that the dissipating device may easily become disengaged, causing damage to the motherboard and hence affecting the normal operation of the computer. Existing dissipating devices are largely comprised of a dissipating means mounted on the CPU and a motor-driven fan located above the dissipating plates. As a general rule, the dissipating plates are fastened to the CPU by means of fastening or mounting means, and the fan is locked to a surface above the dissipating plates by means of screws. However, such a structure is not only troublesome and costly, it is also inconvenient and time-consumptive to assemble.

SUMMARY OF THE INVENTION

Accordingly, a primary object of the present invention is to provide a heat dissipating device for CPUs, in which a dissipating means is provided with a recess near either of two lateral positioning ends thereof, a first positioning strip including a slanting portion with a tongue engaging one of the recesses and a second positioning strip also including a slanting portion with a tongue engages the other of the recesses, the second positioning strip further having a notch engaging a corresponding indentation of a connecting element, accomplishing a positioning means capable of quickly and directly fastening onto a CPU securing substrate to secure the CPU, the dissipating means and the CPU securing substrate firmly together.

Another object of the present invention is to provide a heat dissipating device for CPUs, in which a slip groove is formed between an outermost side dissipating plate and its adjacent dissipating plate of a dissipating means, and a cooling fan is provided with a flange with an inwardly extending insert at either lateral side thereof at a corresponding position for engaging the slip groove directly to eliminate use of screws in assembling the fan to the dissipating means.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1A:
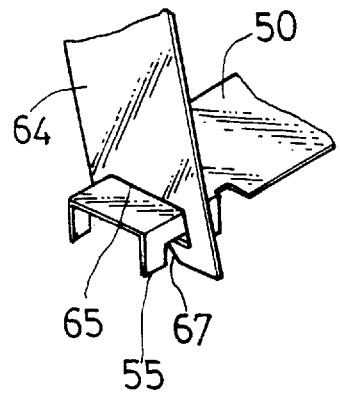
FIG. 1A is a detail view of the connection site of the connecting element and the positioning strip.
Figure 2:
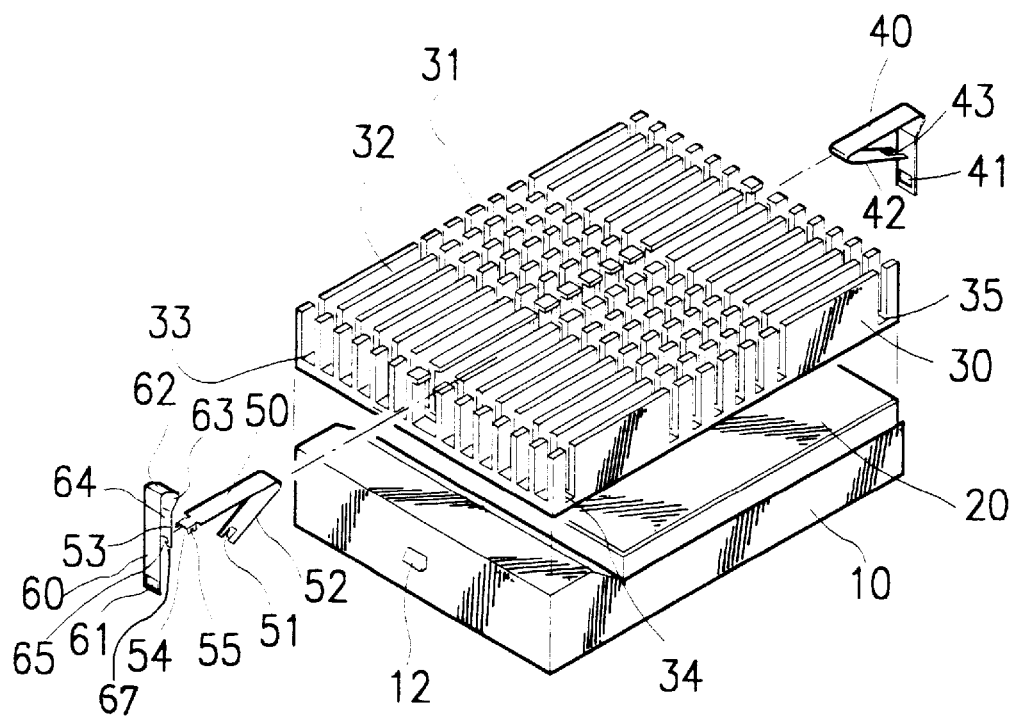
FIG. 2 is an exploded view showing the components of the present invention.
Figure 2A:
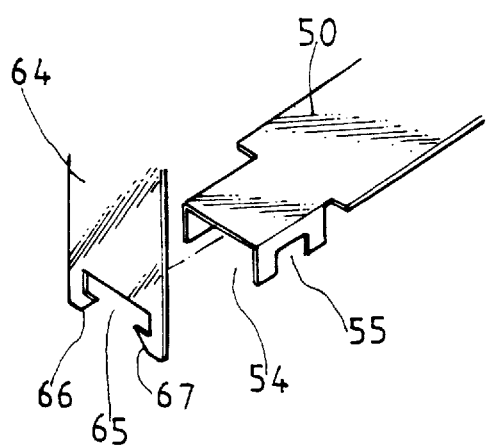
FIG. 2A is a detail view of the connection site of the connecting element and the positioning strip with the elements separated.

With reference to FIGS. 1A and 2A, in which a CPU 20 of a circuit board substrate 10 including borders of different heights is taken as an example, a dissipating means 30 is generally provided on the upper surface of the CPU 20.

It is known that the dissipating means 30 comprises a plurality of dissipating plates 31 equidistantly spaced apart from each other. The space defined between two adjacent dissipating plates 31 forms a groove 32. The grooves 32 are configured to extend downwardly to a certain distance to form respective bottom groove surfaces 33. In this example, near the two sides of the dissipating means 30 are integrally formed respective transverse grooves 34 and 35 that lie at a level below the bottom groove surfaces 33.

Figure 1:
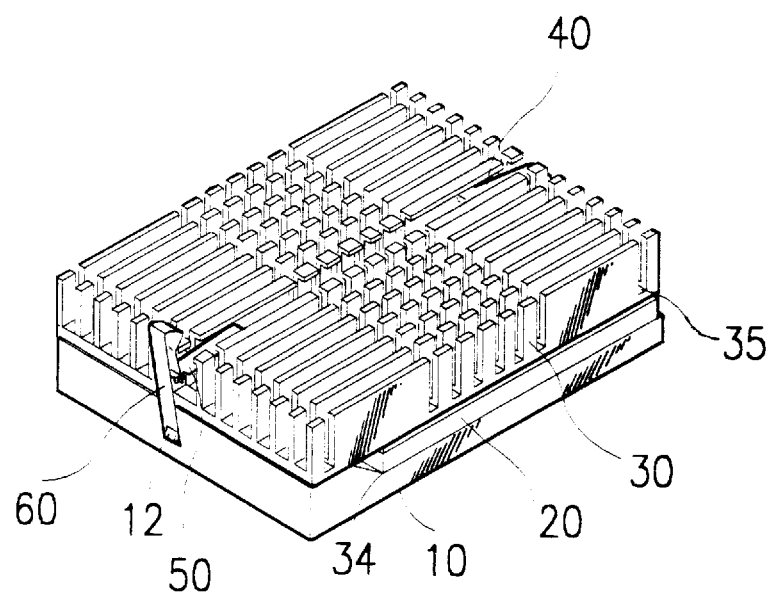
FIG. 1 is an elevational view of a preferred embodiment of the present invention.

Referring to the right side of FIGS. 1 and 2, a positioning strip 40 is disposed at one side of the dissipating means 30 and is substantially folded to have a substantially vertical portion and a substantially horizontal portion. A hook hole 41 is provided at the vertical portion while the horizontal portion bends inwardly to form a slanting portion 42. A free end of the slanting portion 42 is punched to form a tongue 43. Referring now to the left side of the figures, a positioning strip 50 is disposed at the opposite side of the dissipating means 30. The positioning strip 50 includes a substantially horizontal portion with its front end bending inwardly to form a slanting portion 52 having a tongue 51 at its free end. The rear end of the horizontal portion is punched to form two tiny bent pieces 53 and 54 that bend downwardly with respect to the horizontal portion, the bent pieces 53 and 54 defining a notch therebetween.

There is also provided a connecting element 60 that has a substantially vertical portion provided with a hook hole 61 near its bottom end. The top end of the vertical portion of the connecting element 60 bends forwardly, inwardly and then downwardly with respect to the vertical portion of the connecting element 60, forming two bent portions 62, 63 and a bent piece 64 that is substantially parallel to the vertical portion of the connecting element 60. An extreme end of the bent piece 64 is integrally formed to have a indentation 65 with two inwardly bent side pieces 66 and 67 that bend inwardly with respect to the connecting element 60.

Figure 4:
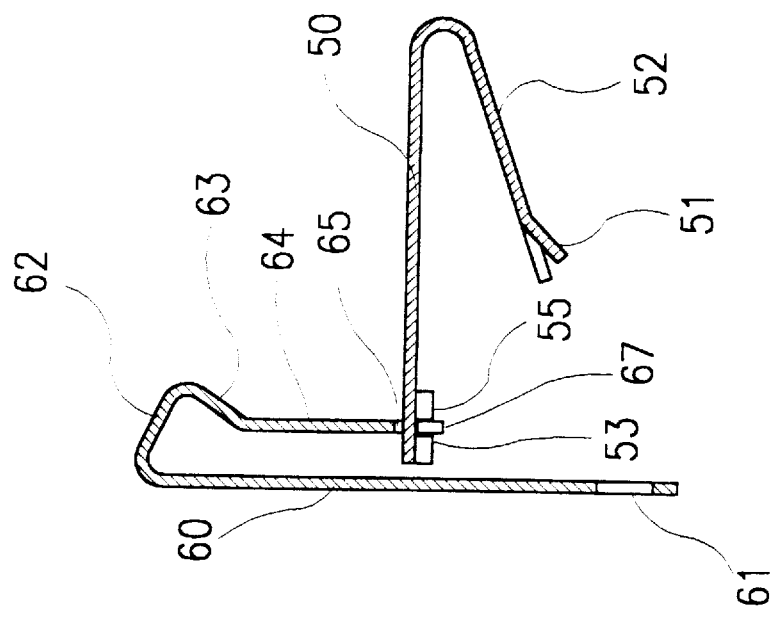
FIG. 4 is a cross section of the preferred embodiment of the present invention.
Figure 5:
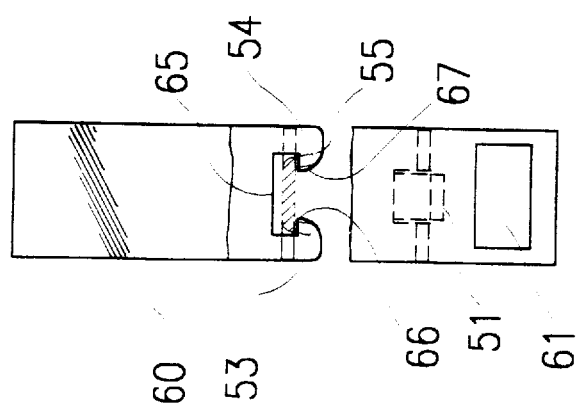
FIG. 5 is an elevational view of the preferred embodiment of the present invention.

Reference is now made to FIGS. 4 and 5. The rear end of the positioning strip 50 may be fitted into the indentation 65 of the connecting element 60 such that the notch 55 formed between the two bent pieces 53 and 54 may just engage the two inwardly bent side pieces 66 and 67 at both sides of the indentation 65 (see FIG. 5).

Figure 3:
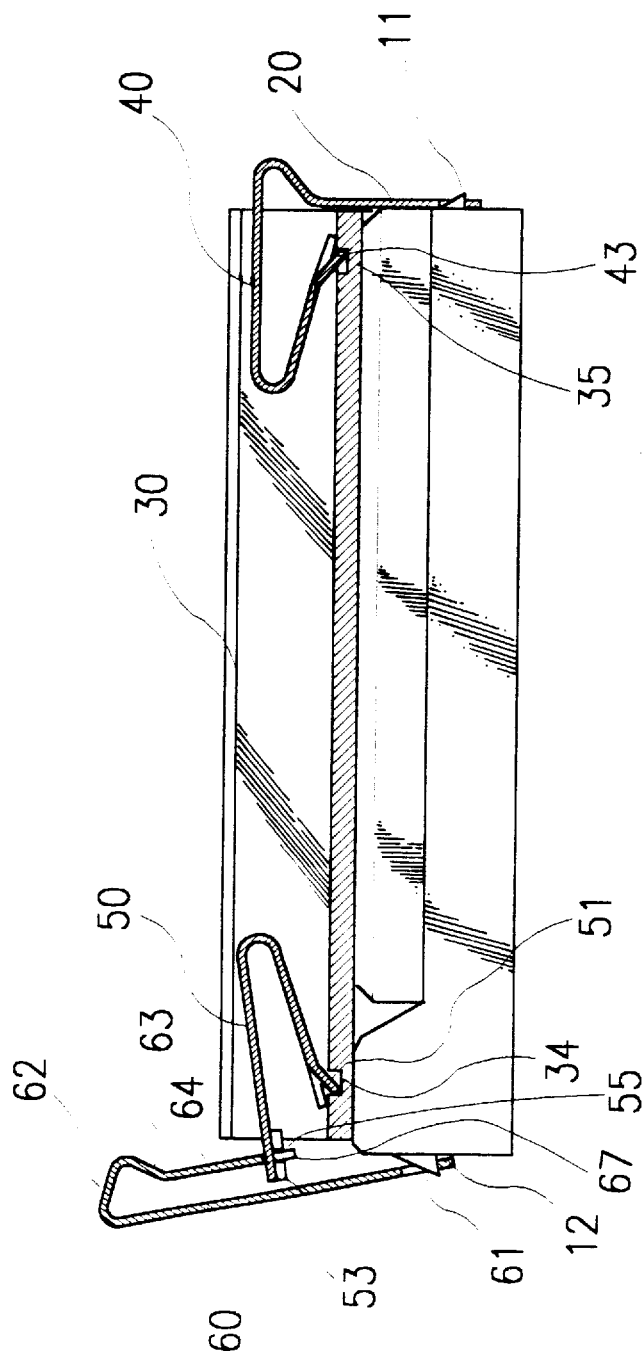
FIG. 3 is a cross-sectional view of FIG. 1.

Referring to FIG. 3, the positioning strip 40 may have its tongue 43 engaged in the transverse groove 35 of the dissipating means 30. Besides, the hook hole 41 of the positioning strip 40 may fit onto a boss 11 preformed at one side of the substrate 10. The other positioning strip 50 may also be connected to the dissipating means in a similar manner. It may also be first connected to the connecting element 60 which has its hook hole 61 engaging another boss 12 on the substrate 10.

Figure 6:
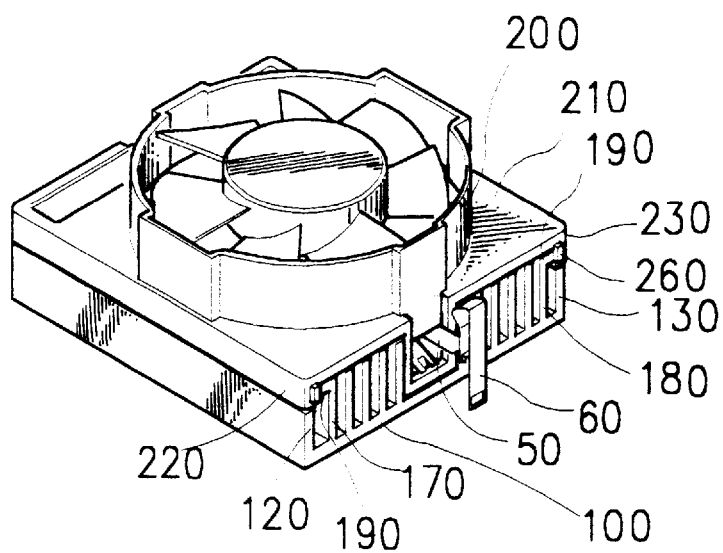
FIG. 6 is a perspective view of another embodiment of the present invention.
Figure 8:
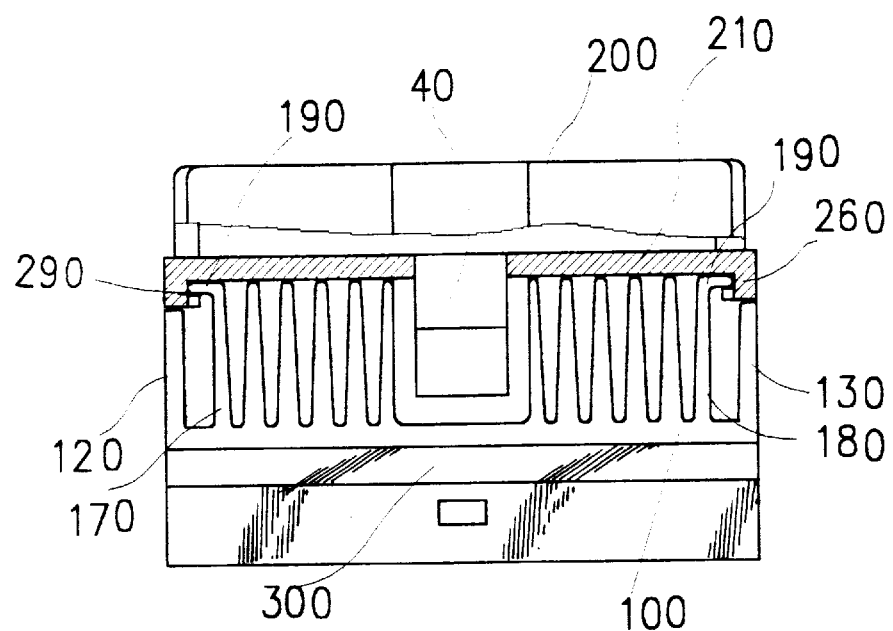
FIG. 8 is a sectional view of the second preferred embodiment of the present invention shown in FIG. 1 showing a first positioning strip in an engaged state.
Figure 9:
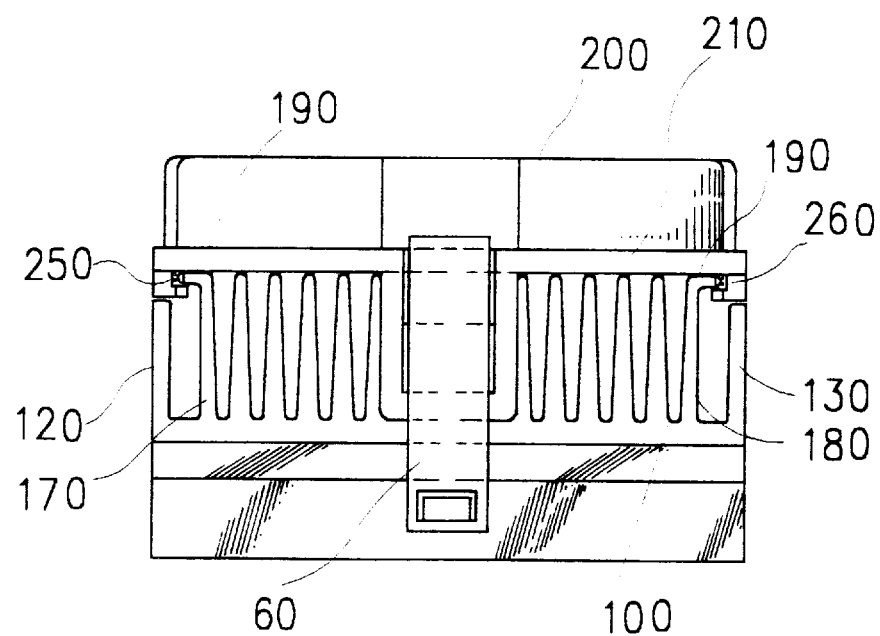
FIG. 9 is a side view of the FIG. 8.

With reference to FIG. 6 which illustrate another embodiment of the present invention, a dissipating means 100 is provided with a motor-driven fan 200 disposed at an upper side thereof. The dissipating means 100 is mounted on a CPU (not shown) by means of a fastening means 300 (see FIG. 8).

Figure 7:
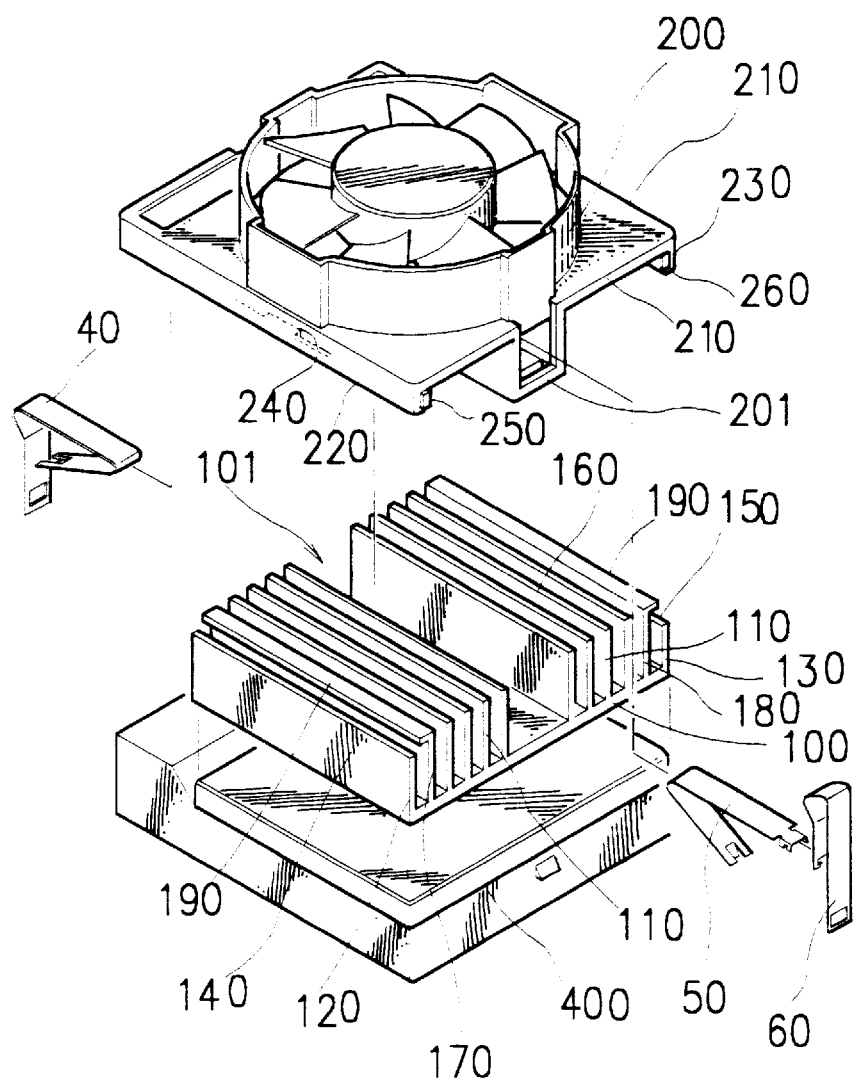
FIG. 7 is an exploded view of the device shown in FIG. 6.

With reference to FIG. 7, the dissipating means 100 is assembled to a CPU 400 using the above-described positioning strips 40 and 50 and the connecting element 60. In this embodiment, the dissipating means 100 has an array of spaced dissipating plates 110 disposed on a bottom plate thereof, with a recess 101 predisposed near a central portion thereof. Two side dissipating plates 120 and 130 are configured to be lower than the other dissipating plates 110, such that the respective top ends 140 and 150 of the side dissipating plates 120 and 130 are spaced a certain distance from the top ends 160 of the dissipating plates 110. The dissipating plates, designated respectively by 170 and 180, adjacent to the side dissipating plates 120 and 130 are each provided with a flap 190 that bends in the direction of its corresponding side dissipating plate to define a slide groove with its corresponding side dissipating plate.

The motor-driven fan 200 is provided with a base plate 210 which may be provided with a protruding hollow tiered portion 201 near a middle portion of its bottom side for engaging the positioning strips 40 and 50 as well as the connecting element 60. Two side flanges 220 and 230 extend along the sides of the base plate 210 and have a thickness matching that of the dissipating plates 110 and a height matching that of the side dissipating plates 120 and 130. These flanges 220 and 230 are each provided with a tongue 240 that projects from a central portion of the inner side of the flange such that it forms a slip clearance 290 (see FIG. 8) with the base plate 210. Small stop pieces 250 and 260 are respectively disposed at the four corners of the base plate 210 where the flanges 220 and 230 join to the base plate 210.

The base plate 210 of the fan 200 is made of plastic materials. As such, referring to FIGS. 6–8, when the entire fan 200 is assembled to the dissipating means 300, it may be inclined slightly so that the respective slip clearances 290 defined by the respective tongues 240 of its flanges 220 and 230 align with the ends of the respective flaps of the dissipating plates 170 and 180 to enable the base plate 210 to be pushed gradually inwardly until the entire base plate 210 of the fan 200 is located on top of the dissipating plates 110, 170, 180 and the side dissipating plates 120 and 130, accomplishing a secure slip-in connection in which the tongues 240 are located below the flaps 190 and the four corners of the dissipating means 100 are positioned by the stop pieces 250 and 260.

In the present invention, since the positioning strips and the connecting element may be continuously punched in an automated process within the factory, the manufacturing process is comparatively quicker and more efficient. Besides, assembly is easy. Moreover, since the fan may be slidably fit onto the dissipating means, there is no need for hole drilling or screw tapping during on-site assembly. Screws or bolts can also be eliminated, which further enhances assembly efficiency and lower costs.

Although the present invention has been illustrated and described with reference to the preferred embodiment thereof, it should be understood that it is in no way limited to the details of such embodiment but is capable of numerous modifications within the scope of the appended claims.

What is claimed is:

1. A means for mounting a heat dissipating device for central processing units, comprising:

a dissipating means disposed on a central processing unit, said dissipating means having at least one first groove adapted to receive positioning strips of said mounting means and at least one transverse groove perpendicular to said first groove, said transverse groove being deeper than said first groove;

a first positioning strip for fastening to one side of said dissipating means, said first positioning strip being bent to form a substantially horizontal portion and a substantially vertical portion, said vertical portion having a hook hole for engaging a substrate of said central processing unit, said horizontal portion having its end bending inwardly to form an inclined portion having an integrally formed tongue for engaging one of said transverse grooves of said dissipating means;

a second positioning strip for fastening to a second side of said dissipating means, said second positioning strip being configured to have an inclined portion with a tongue at a front end thereof for engaging the other of said transverse grooves of said dissipating means and two integrally formed downwardly bent pieces defining a middle notch at a rear end thereof;

a connecting element for engaging said notch of said second positioning strip, said connecting element having a substantially vertical portion with a hook hole near its lower end for engaging said substrate, an upper end of said vertical portion bending forwardly, inwardly and then downwardly to form a bent piece that is substantially parallel to said vertical portion, said bent piece forming an indentation with two inwardly bent side pieces at its extreme end for coupling with said middle notch of said second positioning strip.

2. The heat dissipating device as claimed in claim 1, wherein said transverse grooves are respectively disposed at positions adjacent to opposite sides of said dissipating means and are integrally formed so that they are lower than a planar surface from which dissipating plates of said dissipating means extend upward.

* * * * *